US012696720B2

(12) United States Patent
Wada et al.

(10) Patent No.: US 12,696,720 B2
(45) Date of Patent: Jul. 28, 2026

(54) TRAVEL FACILITY

(71) Applicant: Daifuku Co., Ltd., Osaka (JP)

(72) Inventors: Yoshinari Wada, Hinocho (JP); Kenji Tamura, Hinocho (JP)

(73) Assignee: Daifuku Co., Ltd., Osaka (JP)

( * ) Notice: Subject to any disclaimer, the term of this patent is extended or adjusted under 35 U.S.C. 154(b) by 606 days.

(21) Appl. No.: 18/197,272

(22) Filed: May 15, 2023

(65) Prior Publication Data

US 2023/0365332 A1 Nov. 16, 2023

(30) Foreign Application Priority Data

May 16, 2022 (JP) ................................. 2022-080056

(51) Int. Cl.
| | |
|---|---|
| *H10P 72/30* | (2026.01) |
| *B60L 5/00* | (2006.01) |
| *B61B 3/02* | (2006.01) |
| *B65G 1/04* | (2006.01) |

(52) U.S. Cl.
CPC ............ *H10P 72/3202* (2026.01); *B60L 5/00* (2013.01); *B61B 3/02* (2013.01); *B65G 1/0457* (2013.01); *H10P 72/3208* (2026.01); *H10P 72/3221* (2026.01); *B65G 2201/0297* (2013.01)

(58) Field of Classification Search
CPC ..................... B65G 1/0457; B65G 2201/0297; B61G 3/00; B61G 3/02; B60L 5/00; B60L 5/005; H01L 21/67; H01L 21/677; H01L 21/67703; H01L 21/67706; H01L 21/67715; H01L 21/67733
USPC .............................................. 104/91, 89, 94
See application file for complete search history.

(56) References Cited

FOREIGN PATENT DOCUMENTS

| | | |
|---|---|---|
| JP | 200278102 A | 3/2002 |
| JP | 2011254669 A * | 12/2011 |

* cited by examiner

*Primary Examiner* — S. Joseph Morano
*Assistant Examiner* — Heaven R Buffington
(74) *Attorney, Agent, or Firm* — The Webb Law Firm

(57) ABSTRACT

In a first power reception posture, a first power reception section does not overlap with a first rail and a first feeder cable in a view along a first direction but overlaps with at least one of the first rail and the first feeder cable in a view along a second direction. In a first non-power reception posture, the first power reception section does not overlap with the first rail, the first feeder cable, a second rail, and a second feeder cable in the view along the first direction and the view along the second direction. In a second power reception posture, a second power reception section does not overlap with the second rail and the second feeder cable in the view along the second direction but overlaps with at least one of the second rail and the second feeder cable in the view along the first direction. In a second non-power reception posture, the second power reception section does not overlap with the second rail, the second feeder cable, the first rail, and the first feeder cable in the view along the first direction and the view along the second direction.

8 Claims, 5 Drawing Sheets

TRAVEL FACILITY

CROSS REFERENCE TO RELATED APPLICATION

This application claims priority Japanese Patent Application No. 2022-080056, filed May 16, 2022, the disclosure of which is hereby incorporated by reference in its entirety

BACKGROUND OF THE INVENTION

1. Field of the Invention

The present invention relates to a travel facility including a vehicle.

2. Description of the Related Art

For example, Japanese Unexamined Patent Application Publication No. 2002-078102 (Patent Literature 1) discloses a carrier (3) configured to travel using electric power received from a feeder cable (2) disposed along a traveling rail (1). Note that reference signs described within parentheses in the description of the Description of the Related Art are reference signs used in Patent Literature 1.

In the technology described in Patent Literature 1, a power supply coil (4) projecting outwardly from the carrier (3) in the width direction of a body of the carrier (3) is disposed at a position overlapping with the feeder cable (2) in a view along a top-bottom direction, and hereby, the carrier (3) receives electric power from the feeder cable (2) via the power supply coil (4). At the time when the carrier (3) breaks down, the power supply coil (4) is horizontally retracted inwardly in the width direction of the body, so that the power supply coil (4) is disposed at a position not overlapping with the feeder cable (2) in the view along the top-bottom direction. Hereby, in the technology described in Patent Literature 1, the power supply coil (4) is prevented from interfering with the feeder cable (2) at the time when the broken carrier (3) is lifted and removed from the traveling rail (1).

In the meantime, it is conceivable that, in a case where a carrier travels along a plurality of directions intersecting with each other in a view along the top-bottom direction, feeder cables are disposed along respective directions, so that the carrier travels upon receipt of electric power. However, in this case, even if a power supply coil of the carrier is just horizontally retracted to the carrier side like the technology disclosed in Patent Literature 1, the power supply coil can interfere with the traveling rail or the feeder cables when the carrier travels in an intersection direction from that state. This causes such a problem that the carrier is hard to travel appropriately.

SUMMARY OF THE INVENTION

In view of the above circumstances, it is desired to achieve a technology that allows a vehicle to appropriately travel along each direction while the vehicle receives electric power from feeder cables disposed along directions intersecting with each other in a view along the top-bottom direction.

A technology to solve the problem is as follows.

A travel facility including a vehicle includes: a first rail disposed along a first direction such that the vehicle travels on the first rail; a second rail disposed along a second direction intersecting with the first direction in a view along a top-bottom direction such that the vehicle travels on the second rail; a first feeder cable disposed along the first direction; and a second feeder cable disposed along the second direction. The vehicle includes a first power reception device configured to receive electric power from the first feeder cable, and a second power reception device configured to receive electric power from the second feeder cable. The first power reception device includes a first power reception section, and a first power reception driving section configured to change posture of the first power reception section between a first power reception posture to receive electric power from the first feeder cable and a first non-power reception posture to receive no electric power from the first feeder cable. The second power reception device includes a second power reception section, and a second power reception driving section configured to change posture of the second power reception section between a second power reception posture to receive electric power from the second feeder cable and a second non-power reception posture to receive no electric power from the second feeder cable. In the first power reception posture, the first power reception section does not overlap with the first rail and the first feeder cable in a view along the first direction but overlaps with at least one of the first rail and the first feeder cable in a view along the second direction. In the first non-power reception posture, the first power reception section does not overlap with the first rail, the first feeder cable, the second rail, and the second feeder cable in the view along the first direction and the view along the second direction. In the second power reception posture, the second power reception section does not overlap with the second rail and the second feeder cable in the view along the second direction but overlaps with at least one of the second rail and the second feeder cable in the view along the first direction. In the second non-power reception posture, the second power reception section does not overlap with the second rail, the second feeder cable, the first rail, and the first feeder cable in the view along the first direction and the view along the second direction.

With this configuration, both in a case where the vehicle travels on the first rail and in a case where the vehicle travels on the second rail, it is possible to receive electric power from the feeder cables appropriately. In a case where the vehicle travels on the first rail, the second power reception section configured to receive electric power when the vehicle travels on the second rail takes the second non-power reception posture. In the second non-power reception posture, the second power reception section does not overlap with the second rail, the second feeder cable, the first rail, and the first feeder cable in the view along the first direction and in the second direction. This allows the vehicle to travel along the first rail appropriately while the second power reception section interferes with no rail and no feeder cable. Further, in a case where the vehicle travels on the second rail, the first power reception section configured to receive electric power when the vehicle travels on the first rail takes the first non-power reception posture. In the first non-power reception posture, the first power reception section does not overlap with the first rail, the first feeder cable, the second rail, and the second feeder cable in the view along the first direction and the view along the second direction. This allows the vehicle to travel along the second rail appropriately while the first power reception section interferes with no rail and no feeder cable. Thus, with this configuration, it is possible to cause the vehicle to appropriately travel along each direction while the vehicle receives electric power from the feeder cables disposed along the first direction and the second direction intersecting with each other in a view along the top-bottom direction.

Further features and advantages of the technology according to this disclosure will become clearer by the following illustrative and nonlimiting description of embodiments to described with reference to the drawings.

DESCRIPTION OF THE INVENTION

A travel facility includes a vehicle. The travel facility is used as an article transport facility for transporting articles, for example. In this case, the vehicle is configured as an article carrier configured to carry an article. Various articles are handled as articles to be carried in the article transport facility. For example, in a semiconductor production factory, the articles are a wafer storage container (so-called FOUP: Front Opening Unified Pod) storing wafers, a reticle storage container (so-called reticle pod) storing reticles, and so on. Wafers, reticles, or the like stored in the articles are transported between steps by a vehicle. The following describes embodiments of a travel facility with an example in which the travel facility is used for the article transport facility.

Figure 1:
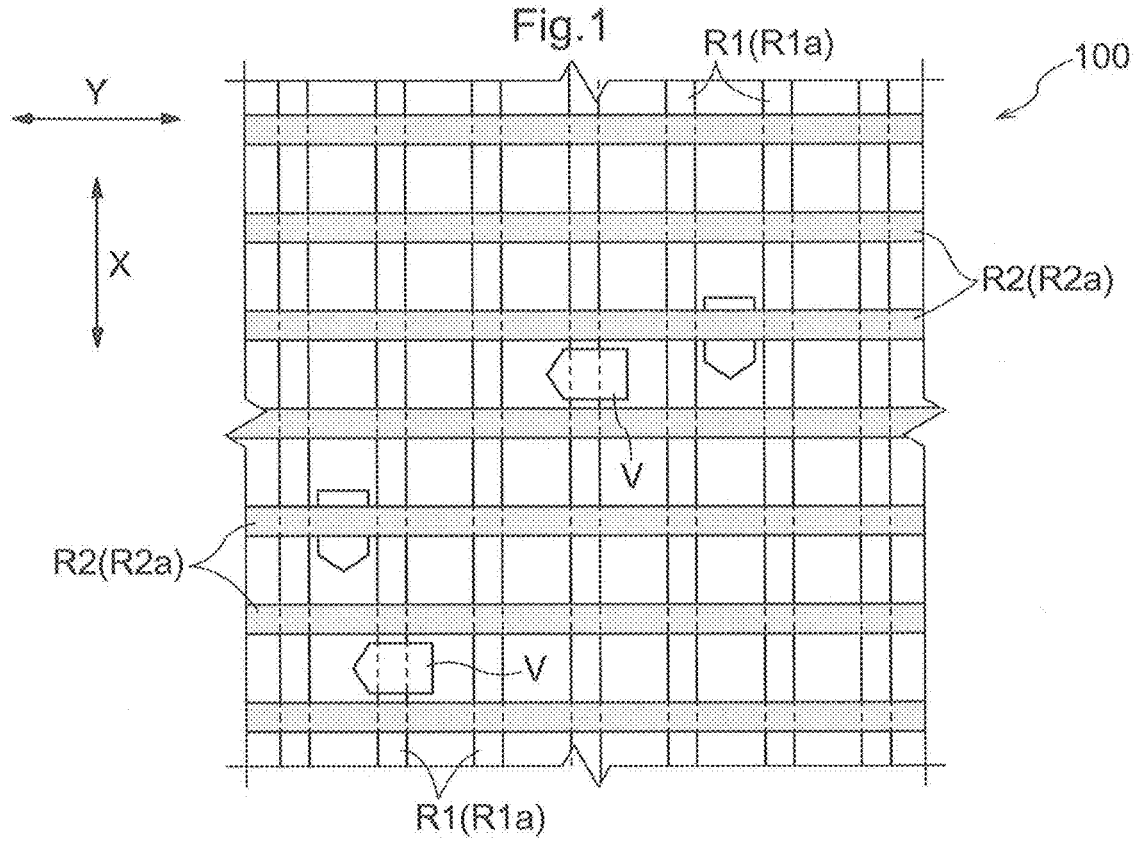
FIG. 1 is a plan view of a travel facility.

As illustrated in FIG. 1, a travel facility 100 includes a first rail R1 disposed along a first direction X such that a vehicle V travels on the first rail R1, and a second rail R2 disposed along a second direction Y such that the vehicle V travels on the second rail R2, the second direction Y intersecting with the first direction X in a view along the top-bottom direction. In the present embodiment, the first direction X and the second direction Y are both along the horizontal direction.

The first rail R1 and the second rail R2 are disposed at different heights. In the present embodiment, the first rail R1 is disposed to be distanced downward from the second rail R2. The second rail R2 is disposed to be distanced upward from the first rail R1.

The first rail R1 disposed along the first direction X and the second rail R2 disposed along the second direction Y intersect with each other when they are viewed in the top-bottom direction. In the present embodiment, the first direction X and the second direction Y are perpendicular to each other when they are viewed in the top-bottom direction. Accordingly, the first rail R1 and the second rail R2 are disposed to be perpendicular to each other when they are viewed in the top-bottom direction.

In the present embodiment, the travel facility 100 includes a plurality of first rails R1 and a plurality of second rails R2. The plurality of first rails R1 is disposed in parallel to each other at the same height to be arranged along the second direction Y. The plurality of second rails R2 is disposed in parallel to each other at the same height to be arranged along the first direction X. In the present embodiment, the plurality of first rails R1 and the plurality of second rails R2 are disposed to form a lattice shape when they are viewed in the top-bottom direction.

In the present embodiment, the first rail R1 includes a pair of first rail bodies R1a such that the first rail bodies R1a are distanced from each other in the second direction Y and extend along the first direction X. The vehicle V is configured to travel along the first direction X while the vehicle V is supported by the pair of first rail bodies R1a constituting the first rail R1.

Figures 3, 4:
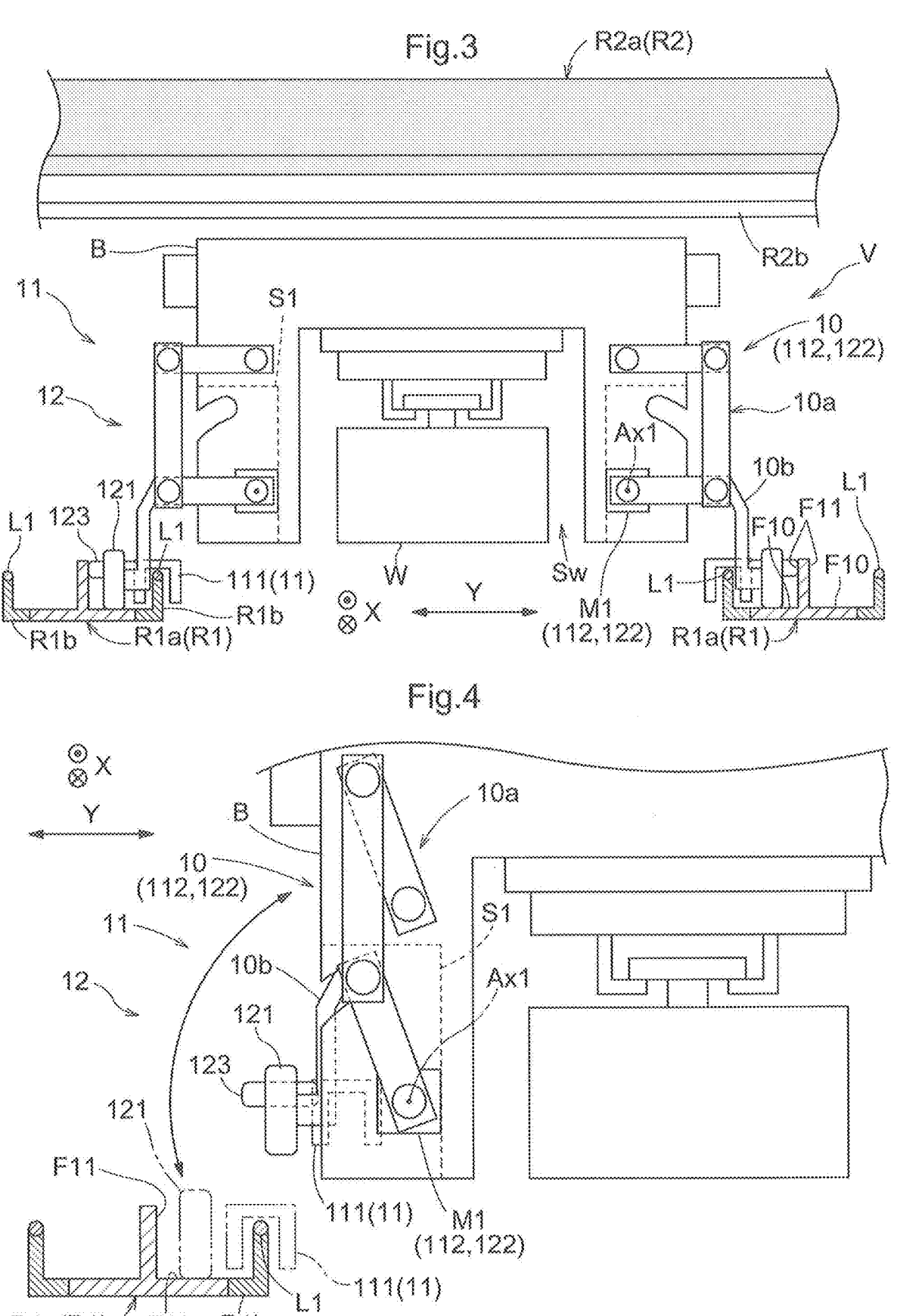
FIG. 3 is a view in a first direction and illustrates a vehicle in a first power reception posture and a first traveling posture.
FIG. 4 is a view in the first direction and illustrates the vehicle in a first non-power reception posture and a first non-traveling posture.

In the present embodiment, the first rail body R1a is configured to support the vehicle V on one side in the second direction Y and to support another vehicle V on the other side in the second direction Y. That is, as illustrated in FIG. 3, the first rail body R1a includes a pair of first travel faces F10 for a first wheel 121 (described later) to roll. Further, in the present embodiment, the first rail body R1a includes a pair of first guide faces F11 for a first guide wheel 123 (described later) to roll. Thus, in the present embodiment, one first rail body R1a is configured to support two vehicles V arranged in the second direction Y and configured to travel side by side along the first direction X (only one vehicle V is illustrated in the figure).

In the present embodiment, the second rail R2 includes a pair of second rail bodies R2a such that the second rail bodies R2a are distanced from each other in the first direction X and extend along the second direction Y. The vehicle V is configured to travel along the second direction Y while the vehicle V is supported by the pair of second rail bodies R2a constituting the second rail R2.

Figure 5:
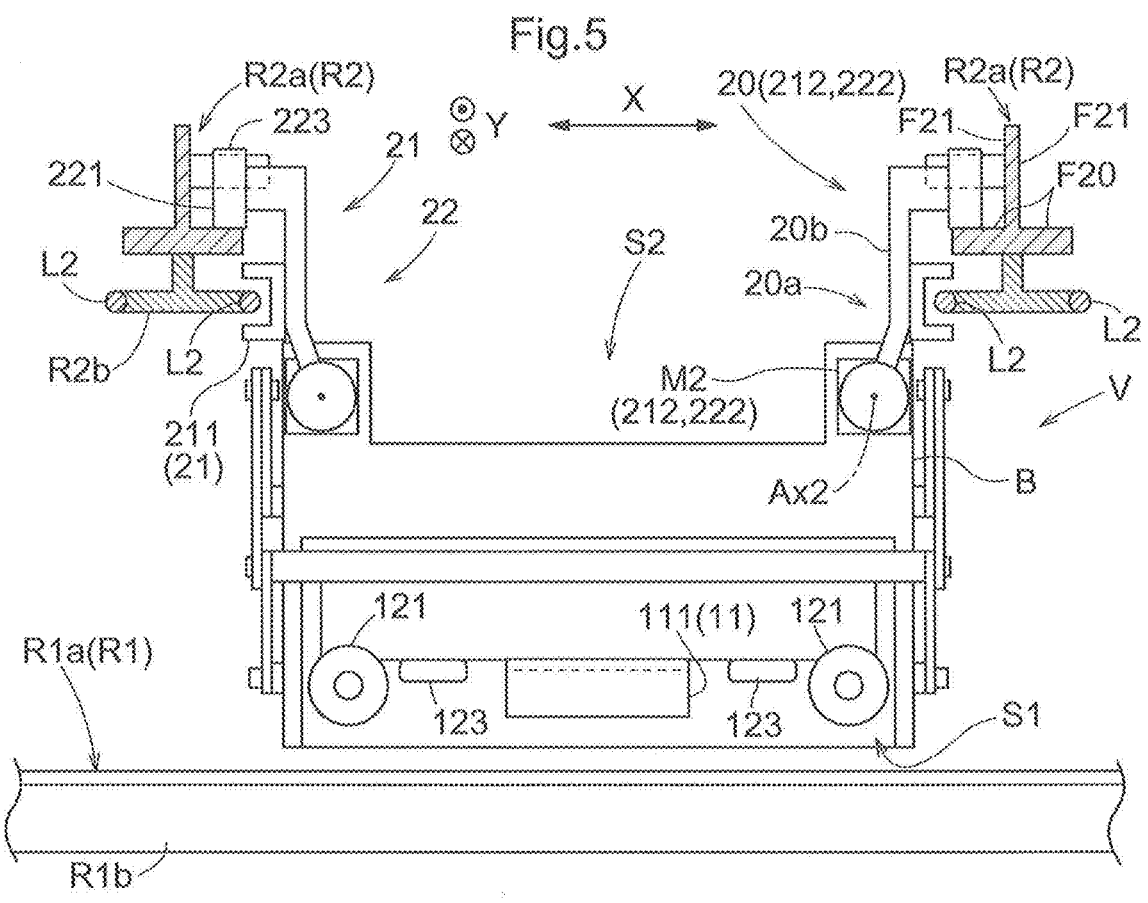
FIG. 5 is a view in a second direction and illustrates the vehicle in a second power reception posture and a second traveling posture.

In the present embodiment, the second rail body R2a is configured to support the vehicle V on one side in the first direction X and to support another vehicle V on the other side in the first direction X. That is, as illustrated in FIG. 5, the second rail body R2a includes a pair of second travel faces F20 for a second wheel 221 (described later) to roll. Further, in the present embodiment, the second rail body R2a includes a pair of second guide faces F21 for a second guide wheel 223 (described later) to roll. Thus, in the present embodiment, one second rail body R2a is configured to support two vehicles V arranged in the first direction X and configured to travel side by side along the second direction Y (only one vehicle V is illustrated in the figure).

The travel facility 100 includes a first feeder cable L1 (see FIG. 3) disposed along the first direction X and a second feeder cable L2 (see FIG. 5) disposed along the second direction Y. In the present embodiment, the first feeder cable L1 is disposed to be distanced downward from the second feeder cable L2. The second feeder cable L2 is disposed to be distanced upward from the first feeder cable L1.

As illustrated in FIG. 3, in the present embodiment, the first feeder cable L1 is disposed along the first rail R1. More specifically, the first feeder cable L1 is disposed along each of the pair of first rail bodies R1a constituting the first rail R1. In the present embodiment, the first rail body R1a is provided with a first holding portion R1b configured to hold the first feeder cable L1 over the first direction X. The first feeder cable L1 is held by the first holding portion R1*b* to be disposed along the first direction X. In the example illustrated herein, the first holding portion R1*b* is disposed to project from the first rail body R1*a* in the second direction Y.

As illustrated in FIG. 5, in the present embodiment, the second feeder cable L2 is disposed along the second rail R2. More specifically, the second feeder cable L2 is disposed along each of the pair of second rail bodies R2*a* constituting the second rail R2. In the present embodiment, the second rail body R2*a* is provided with a second holding portion R2*b* configured to hold the second feeder cable L2 over the second direction Y. The second feeder cable L2 is held by the second holding portion R2*b* to be disposed along the second direction Y. In the example illustrated herein, the second holding portion R2*b* is disposed to project downward from the second rail body R2*a*.

The vehicle V is configured to travel along each of the first direction X and the second direction Y. When the vehicle V travels along the first direction X, the vehicle V is supported by the first rail R1 and travels. When the vehicle V travels along the second direction Y, the vehicle V is supported by the second rail R2 and travels.

As illustrated in FIG. 3, in the present embodiment, the vehicle V includes a body B and an article storage section Sw provided inside the body B and storing an article W targeted for transport. The article storage section Sw is formed to open on the bottom surface of the body B. The vehicle V is configured to transfer the article W by raising and lowering the article W between the article storage section Sw and a transfer target spot (not illustrated) provided below the first rail R1 and the second rail R2. Since the article storage section Sw is formed to open on the bottom surface of the body B as described above, the article W is easily raised and lowered between the article storage section Sw and the transfer target spot.

The vehicle V includes a first power reception device 11 (see FIG. 3) configured to receive electric power from the first feeder cable L1, and a second power reception device 21 (see FIG. 5) configured to receive electric power from the second feeder cable L2. In the present embodiment, the vehicle V includes a first travel unit 12 (see FIG. 3) for traveling on the first rail R1, and a second travel unit 22 (see FIG. 5) for traveling on the second rail R2. In the present embodiment, the vehicle V includes a pair of first power reception devices 11 and a pair of first travel units 12. The pair of first power reception devices 11 is disposed to be distanced from each other in the second direction Y, and the pair of first travel units 12 is disposed to be distanced from each other in the second direction Y (see FIG. 3). Further, in the present embodiment, the vehicle V includes a pair of second power reception devices 21 and a pair of second travel units 22. The pair of second power reception devices 21 is disposed to be distanced from each other in the first direction X, and the pair of second travel units 22 is disposed to be distanced from each other in the first direction X (see FIG. 5).

The vehicle V is configured to travel on the first rail R1 by the first travel units 12 by use of electric power acquired by the first power reception device 11. More specifically, the vehicle V rotates the first wheel 121 by use of the electric power to travel on the first rail R1. Further, the vehicle V is configured to travel on the second rail R2 by the second travel units 22 by use of electric power acquired by the second power reception device 21. More specifically, the vehicle V rotates the second wheel 221 by use of the electric power to travel on the second rail R2. Note that the vehicle V may be configured to accumulate part of or all electric power acquired by each of the power reception devices 11, 21 in a battery and to travel on each of the rails R1, R2 by use of the electric power thus accumulated in the battery.

Figure 2:
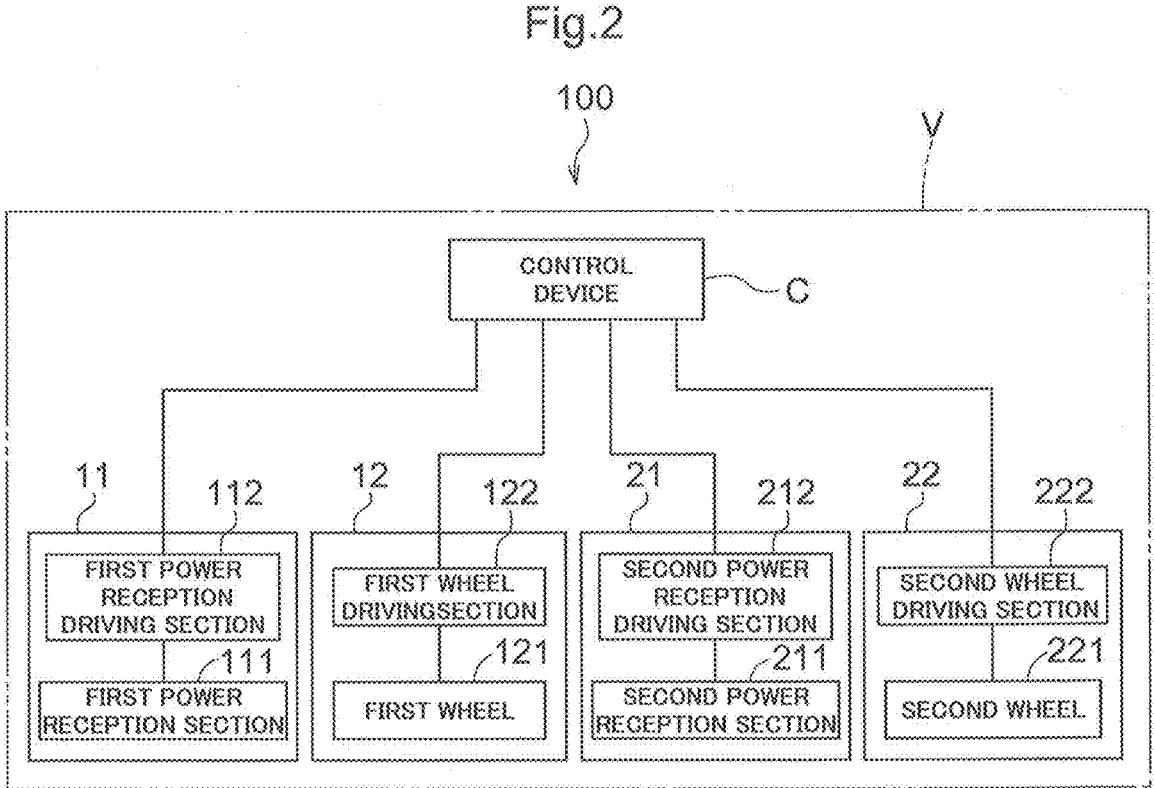
FIG. 2 is a control block diagram.

As illustrated in FIG. 2, the travel facility 100 includes a control device C configured to control the first power reception device 11 and the second power reception device 21. In the present embodiment, the control device C controls the first travel unit 12 and the second travel unit 22 in addition to the first power reception device 11 and the second power reception device 21. In the present embodiment, the control device C is provided in the vehicle V and is configured to control each section of the vehicle V. The control device C includes a processor such as a microcomputer, a peripheral circuit such as a memory, and so on, for example. When such hardware collaborates with a program to be executed on a processor of a computer or the like, each process or each function is implemented.

The first power reception device 11 includes a first power reception section 111, and a first power reception driving section 112 configured to change the posture of the first power reception section 111 between a first power reception posture to receive electric power from the first feeder cable L1 and a first non-power reception posture to receive no electric power from the first feeder cable L1. The control device C is configured to transmit a control signal to the first power reception driving section 112. Upon receipt of the control signal from the control device C, the first power reception driving section 112 drives a support mechanism (a first support mechanism 10 (described later) in the present embodiment) for the first power reception section 111 based on the control signal to cause the support mechanism to change the posture of the first power reception section 111. Note that details of the first power reception posture and the first non-power reception posture will be described later.

The first travel unit 12 includes the first wheel 121, and a first wheel driving section 122 configured to change the posture of the first wheel 121 between a first traveling posture and a first non-traveling posture. The control device C is configured to transmit a control signal to the first wheel driving section 122. Upon receipt of the control signal from the control device C, the first wheel driving section 122 drives a support mechanism (the first support mechanism 10 (described later) in the present embodiment) for the first wheel 121 based on the control signal to cause the support mechanism to change the posture of the first wheel 121. Note that details of the first traveling posture and the first non-traveling posture will be described later.

The second power reception device 21 includes a second power reception section 211, and a second power reception driving section 212 configured to change the posture of the second power reception section 211 between a second power reception posture to receive electric power from the second feeder cable L2 and a second non-power reception posture to receive no electric power from the second feeder cable L2. The control device C is configured to transmit a control signal to the second power reception driving section 212. Upon receipt of the control signal from the control device C, the second power reception driving section 212 drives a support mechanism (a second support mechanism 20 (described later) in the present embodiment) for the second power reception section 211 based on the control signal to cause the support mechanism to change the posture of the second power reception section 211. Note that details of the second power reception posture and the second non-power reception posture will be described later.

The second travel unit 22 includes the second wheel 221, and a second wheel driving section 222 configured to change the posture of the second wheel 221 between a second traveling posture and a second non-traveling posture. The control device C is configured to transmit a control signal to the second wheel driving section 222. Upon receipt of the control signal from the control device C, the second wheel driving section 222 drives a support mechanism (the second support mechanism 20 (described later) in the present embodiment) for the second wheel 221 based on the control signal to cause the support mechanism to change the posture of the second wheel 221. Note that details of the second traveling posture and the second non-traveling posture will be described later.

As illustrated in FIG. 3, in a case where the vehicle V travels along the first direction X, the control device C controls the first power reception driving section 112 such that the first power reception section 111 takes the first power reception posture.

The first power reception section 111 receives electric power from the first feeder cable L1 in the first power reception posture. More specifically, a magnetic field is generated on the first feeder cable L1 side by a current flowing through the first feeder cable L1. The first power reception section 111 includes a coil unit and a magnetic body. The first power reception section 111 receives electric power from the first feeder cable L1 by use of electromagnetic induction to cause electromotive force in the first power reception section 111 by the magnetic field generated on the first feeder cable L1 side.

In the first power reception posture, the first power reception section 111 does not overlap with the first rail R1 and the first feeder cable L1 in a view along the first direction X but overlaps with at least either of the first rail R1 and the first feeder cable L1 in a view along the second direction Y. In the example illustrated in FIG. 3, in the first power reception posture, the first power reception section 111 overlaps with both the first rail R1 and the first feeder cable L1 in the view along the second direction Y.

In the present embodiment, in the first power reception posture, the first power reception section 111 is disposed to surround the first feeder cable L1 from its top side and both sides in the second direction Y. Further, both sides of the first power reception section 111 in the first direction X are opened. Accordingly, the first power reception section 111 is movable along the first direction X while the first power reception section 111 maintains the first power reception posture in which the first power reception section 111 surrounds the first feeder cable L1 from its top side and both sides in the second direction Y.

As illustrated in FIG. 3, in a case where the vehicle V travels along the first direction X, the control device C controls the first wheel driving section 122 such that the first wheel 121 takes the first traveling posture.

In the first traveling posture, while the first wheel 121 makes contact with the top surface (hereinafter referred to as a "first travel face F10") of the first rail R1 and rolls, the first wheel 121 overlaps with at least either of the first rail R1 and the first feeder cable L1 in the view along the second direction Y. In the example illustrated in FIG. 3, in the first traveling posture, the first wheel 121 overlaps with both the first rail R1 and the first feeder cable L1 in the view along the second direction Y.

In the present embodiment, the vehicle V includes the first guide wheel 123 guided along the first direction X. The position of the first guide wheel 123 is fixed to the first wheel 121 and is configured to change its posture in conjunction with the change in the posture of the first wheel 121. In a state where the first wheel 121 has the first traveling posture, while the first guide wheel 123 makes contact with a guide face (hereinafter referred to as the "first guide face F11") of the first rail R1 and rolls, the first guide wheel 123 overlaps with at least either of the first rail R1 and the first feeder cable L1 in the view along the second direction Y. In the example illustrated in FIG. 3, in a state where the first wheel 121 has the first traveling posture, the first guide wheel 123 overlaps with both the first rail R1 and the first feeder cable L1 in the view along the second direction Y.

In the present embodiment, the first travel face F10 is constituted by a surface, of the first rail R1, facing upward. The first guide face F11 is constituted by a surface, of the first rail R1, facing the second direction Y. In a state where the first wheel 121 has the first traveling posture, the rotation axis of the first wheel 121 is along the second direction Y, and an outer peripheral surface of the first wheel 121 makes contact with the first travel face F10. Further, in a state where the first wheel 121 has the first traveling posture, the rotation axis of the first guide wheel 123 is along the top-bottom direction, and an outer peripheral surface of the first guide wheel 123 makes contact with the first guide face F11.

As illustrated in FIG. 4, in a case where the vehicle V travels along the second direction Y, the control device C controls the first power reception driving section 112 such that the first power reception section 111 takes the first non-power reception posture.

In the first non-power reception posture, the first power reception section 111 does not overlap with the first rail R1, the first feeder cable L1, the second rail R2, and the second feeder cable L2 (also see FIG. 3) in the view along the first direction X and the view along the second direction Y. In other words, in the first non-power reception posture, the first power reception section 111 is disposed at a height different from the first rail R1, the first feeder cable L1, the second rail R2, and the second feeder cable L2. As described above, in the first power reception posture, the first power reception section 111 overlaps with both the first rail R1 and the first feeder cable L1 in the view along the second direction Y (see FIG. 3). Accordingly, when the vehicle V is to travel along the second direction Y in a state where the first power reception section 111 has the first power reception posture, the first power reception section 111 interferes with the first rail R1 and the first feeder cable L1, so that the vehicle V cannot travel appropriately. However, when the first power reception section 111 has the first non-power reception posture, the first power reception section 111 does not overlap with the second rail R2 and the second feeder cable L2 in addition to the first rail R1 and the first feeder cable L1 in the view along the first direction X and the view along the second direction Y (see FIG. 4). Accordingly, in a state where the first power reception section 111 has the first non-power reception posture, even when the vehicle V is to travel along the second direction Y, the first power reception section 111 does not interfere with any of the aforementioned members. This accordingly allows the vehicle V to travel along the second direction Y appropriately. Thus, in a case where the vehicle V travels along the second direction Y, the control device C controls the first power reception driving section 112 such that the first power reception section 111 takes the first non-power reception posture.

Here, in the present embodiment, the vehicle V includes the first storage section S1 storing the first power reception section 111. At least part of the first power reception section 111 is stored in the first storage section S1 in the first non-power reception posture of the first power reception section 111. In the present embodiment, the first storage section S1 is provided to face a side face (a surface facing the second direction Y) of the body B.

As illustrated in FIG. 4, in a case where the vehicle V travels along the second direction Y, the control device C controls the first wheel driving section 122 such that the first wheel 121 takes the first non-traveling posture.

In the first non-traveling posture, while the first wheel 121 is distanced from the first rail R1, the first wheel 121 does not overlap with the first rail R1, the first feeder cable L1, the second rail R2, and the second feeder cable L2 (also see FIG. 3) in the view along the first direction X and the view in the second direction Y. In other words, in the first non-power reception posture, the first wheel 121 is disposed at a height different from the first rail R1, the first feeder cable L1, the second rail R2, and the second feeder cable L2. As described above, in the first traveling posture, the first wheel 121 overlaps with both the first rail R1 and the first feeder cable L1 in the view along the second direction Y (see FIG. 3). Accordingly, when the vehicle V is to travel along the second direction Y in a state where the first wheel 121 has the first traveling posture, the first wheel 121 interferes with the first rail R1 and the first feeder cable L1, so that the vehicle V cannot travel appropriately. However, when the first wheel 121 takes the first non-traveling posture, the first wheel 121 does not overlap with the second rail R2 and the second feeder cable L2 in addition to the first rail R1 and the first feeder cable L1 in the view along the first direction X and the view along the second direction Y (see FIG. 4). Accordingly, in a state where the first wheel 121 has the first non-traveling posture, even when the vehicle V is to travel along the second direction Y, the first wheel 121 does not interfere with any of the aforementioned members. This allows the vehicle V to travel along the second direction Y appropriately. On this account, in a case where the vehicle V travels along the second direction Y, the control device C controls the first wheel driving section 122 such that the first wheel 121 takes the first non-traveling posture.

In the present embodiment, when the first wheel 121 has the first non-traveling posture, the first guide wheel 123 is distanced from the first rail R1 and does not overlap with the first rail R1, the first feeder cable L1, the second rail R2, and the second feeder cable L2 in the view along the first direction X and the view along the second direction Y. In other words, in a state where the first wheel 121 has the first non-traveling posture, the first guide wheel 123 is disposed at a height different from the first rail R1, the first feeder cable L1, the second rail R2, and the second feeder cable L2. Hereby, in a state where the first wheel 121 has the first non-traveling posture, even when the vehicle V is to travel along the second direction Y, the first guide wheel 123 also does not interfere with any of the aforementioned members. This accordingly allows the vehicle V to travel along the second direction Y appropriately.

As illustrated in FIGS. 3, 4, in the present embodiment, the first wheel 121 and the first power reception section 111 are configured to change their postures in conjunction with each other. In the present embodiment, the first power reception driving section 112 configured to change the posture of the first power reception section 111 and the first wheel driving section 122 configured to change the posture of the first wheel 121 are configured to operate in conjunction with each other. Accordingly, the first power reception section 111 and the first wheel 121 change their postures around the same time. Here, "to operate in conjunction with each other" includes a case where a plurality of members operates in conjunction with each other by a mechanical structure and a case where a plurality of members controllably operates in conjunction with each other even though they have different mechanical structures. Further, "around the same time" includes the same timing and a period with some time difference.

In the present embodiment, the first power reception driving section 112 and the first wheel driving section 122 include a first support mechanism 10 for common use and a first drive source M1 configured to operate the first support mechanism 10. The first power reception section 111 and the first wheel 121 are attached to the first support mechanism 10. In the present embodiment, the first power reception section 111 and the first wheel 121 are attached to the same first support mechanism 10 so that the first power reception section 111 and the first wheel 121 are configured to change their postures in conjunction with each other.

In the present embodiment, the first support mechanism 10 includes a link mechanism 10*a* including a plurality of link members rotatably connected to each other, and a first support member 10*b* attached to the link mechanism 10*a* and configured to support the first power reception section 111 and the first wheel 121. The first drive source M1 is constituted by use of an electric motor, for example.

In the present embodiment, the plurality of link members constituting the link mechanism 10*a* is connected to each other to be rotatable around an axis along the first direction X. Among the plurality of link members, a link member having a rotational base end part connected to the body B is configured to be rotationally driven by the first drive source M1 around a swing axis (referred to as a "first swing axis Ax1") along the first direction X. That is, the first support mechanism 10 is supported by the body B of the vehicle V to swing around the first swing axis Ax1 along the first direction X.

In the present embodiment, the first support member 10*b* is fixed to any of the plurality of link members constituting the link mechanism 10*a*. The first support member 10*b* supports the first power reception section 111 below the body B in a state where the first power reception section 111 has the first power reception posture (the state illustrated in FIG. 3). Further, the first support member 10*b* supports the first wheel 121 below the body B in a state where the first wheel 121 has the first traveling posture (the state illustrated in FIG. 3).

Further, the first support member 10*b* supports the first power reception section 111 above the first rail R1 and the first feeder cable L1 in a state where the first power reception section 111 has the first non-power reception posture (the state illustrated in FIG. 4). Further, the first support member 10*b* supports the first wheel 121 above the first rail R1 and the first feeder cable L1 in a state where the first wheel 121 has the first non-traveling posture (the state illustrated in FIG. 4).

In the present embodiment, the first drive source M1 operates the first support mechanism 10 so that the first support mechanism 10 changes its posture between a first operation posture (see FIG. 3) in which the first power reception section 111 has the first power reception posture and the first wheel 121 has the first traveling posture and a first pause posture (see FIG. 4) in which the first power reception section 111 has the first non-power reception posture and the first wheel 121 has the first non-traveling posture. Then, in a case where the first support mechanism 10 changes its posture from the first pause posture to the first operation posture, the first wheel 121 is lowered from the top side relative to the first rail R1 and disposed at a position where the first wheel 121 makes contact with the top surface (the first travel face F10) of the first rail R1, and the first power reception section 111 is disposed at a position where the first power reception section 111 faces the first feeder cable L1 from above (see FIG. 3). In a case where the first support mechanism 10 changes its posture from the first operation posture to the first pause posture, the first power reception section 111 and the first wheel 121 move reversely to the above. In the present embodiment, in a state where the first support mechanism 10 has the first pause posture, at least part of the first power reception section 111 is stored in the first storage section S1 (see FIG. 4).

As illustrated in FIG. 5, in a case where the vehicle V travels along the second direction Y, the control device C controls the second power reception driving section 212 such that the second power reception section 211 takes the second power reception posture.

The second power reception section 211 receives electric power from the second feeder cable L2 in the second power reception posture. More specifically, a magnetic field is generated on the second feeder cable L2 side by a current flowing through the second feeder cable L2. The second power reception section 211 includes a coil unit and a magnetic body. The second power reception section 211 receives electric power from the second feeder cable L2 by use of electromagnetic induction to cause electromotive force in the second power reception section 211 by the magnetic field generated on the second feeder cable L2 side.

In the second power reception posture, the second power reception section 211 does not overlap with the second rail R2 and the second feeder cable L2 in the view along the second direction Y but overlaps with at least either of the second rail R2 and the second feeder cable L2 in the view along the first direction X. In the example illustrated in FIG. 5, in the second power reception posture, the second power reception section 211 does not overlap with the second rail R2 in the view along the first direction X but overlaps with the second feeder cable L2 in the view along the first direction X.

In the present embodiment, in the second power reception posture, the second power reception section 211 is disposed to surround the second feeder cable L2 from both sides in the top-bottom direction and from one side (the body B side) in the second direction Y. Further, both sides of the second power reception section 211 in the second direction Y are opened. Accordingly, the second power reception section 211 is movable along the second direction Y while the second power reception section 211 maintains the second power reception posture in which the second feeder cable L2 is surrounded from both sides in the top-bottom direction and the one side (the body B side) in the second direction Y.

As illustrated in FIG. 5, in a case where the vehicle V travels along the second direction Y, the control device C controls the second wheel driving section 222 such that the second wheel 221 takes the second traveling posture.

In the second traveling posture, while the second wheel 221 makes contact with a top surface (hereinafter referred to as the "second travel face F20") of the second rail R2 and rolls, the second wheel 221 overlaps with at least either of the second rail R2 and the second feeder cable L2 in the view along the first direction X. In the example of FIG. 5, in the second traveling posture, the second wheel 221 overlaps with the second rail R2 in the view along the first direction X and does not overlap with the second feeder cable L2 in the view along the first direction X.

In the present embodiment, the vehicle V includes the second guide wheel 223 guided along the second direction Y. The position of the second guide wheel 223 is fixed to the second wheel 221 and is configured to change its posture in conjunction with the change in the posture of the second wheel 221. In a state where the second wheel 221 has the second traveling posture, while the second guide wheel 223 makes contact with a guide face (hereinafter referred to as the "second guide face F21") of the second rail R2 and rolls, the second guide wheel 223 overlaps with at least either of the second rail R2 and the second feeder cable L2 in the view along the first direction X. In the example of FIG. 5, in a state where the second wheel 221 has the second traveling posture, the second guide wheel 223 overlaps with the second rail R2 in the view along the first direction X and does not overlap with the second feeder cable L2 in the view along the first direction X.

In the present embodiment, the second travel face F20 is constituted by a surface, of the second rail R2, facing upward. The second guide face F21 is constituted by a surface, of the second rail R2, facing the first direction X. In a state where the second wheel 221 has the second traveling posture, the rotation axis of the second wheel 221 is along the first direction X, and an outer peripheral surface of the second wheel 221 makes contact with the second travel face F20. Further, in a state where the second wheel 221 has the second traveling posture, the rotation axis of the second guide wheel 223 is along the top-bottom direction, and an outer peripheral surface of the second guide wheel 223 makes contact with the second guide face F21.

Figure 6:
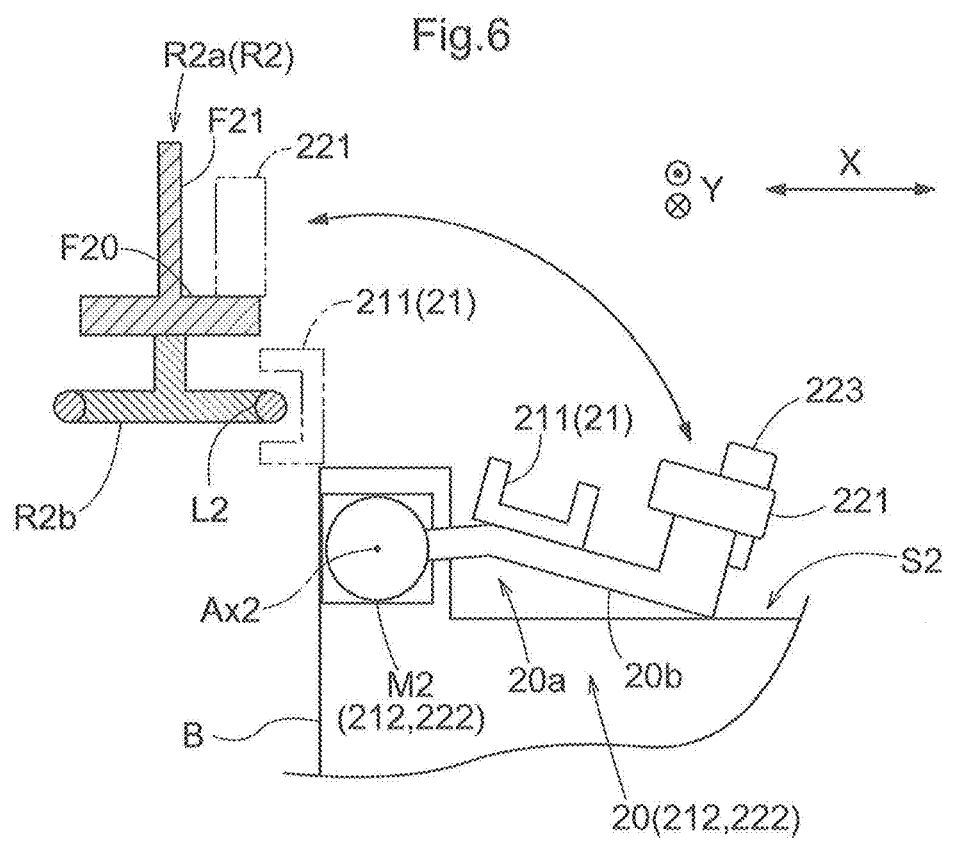
FIG. 6 is a view in the second direction and illustrates the vehicle in a second non-power reception posture and a second non-traveling posture.

As illustrated in FIG. 6, in a case where the vehicle V travels along the first direction X, the control device C controls the second power reception driving section 212 such that the second power reception section 211 takes the second non-power reception posture.

In the second non-power reception posture, the second power reception section 211 does not overlap with the second rail R2, the second feeder cable L2, the first rail R1, and the first feeder cable L1 (also see FIG. 5) in the view along the first direction X and the view along the second direction Y. In other words, in the second non-power reception posture, the second power reception section 211 is disposed at a height different from the second rail R2, the second feeder cable L2, the first rail R1, and the first feeder cable L1. As described above, in the second power reception posture, the second power reception section 211 overlaps with the second feeder cable L2 in the view along the first direction X (see FIG. 5). Accordingly, when the vehicle V is to travel along the first direction X in a state where the second power reception section 211 has the second power reception posture, the second power reception section 211 interferes with the second feeder cable L2, so that the vehicle V cannot travel appropriately. However, when the second power reception section 211 takes the second non-power reception posture, the second power reception section 211 does not overlap with the first rail R1 and the first feeder cable L1 in addition to the second rail R2 and the second feeder cable L2 in the view along the first direction X and the view along the second direction Y (see FIG. 6). On this account, in a state where the second power reception section 211 has the second non-power reception posture, even when the vehicle V is to travel along the first direction X, the second power reception section 211 does not interfere with any of the aforementioned members. This accordingly allows the vehicle V to travel along the first direction X appropriately. On this account, in a case where the vehicle V travels along the first direction X, the control device C controls the second power reception driving section 212 such that the second power reception section 211 takes the second non-power reception posture.

Here, in the present embodiment, the vehicle V includes the second storage section S2 storing the second power reception section 211. At least part of the second power reception section 211 is stored in the second storage section S2 in the second non-power reception posture of the second power reception section 211. In the present embodiment, the second storage section S2 is provided on the top surface of the body B.

As illustrated in FIG. 6, in a case where the vehicle V travels along the first direction X, the control device C controls the second wheel driving section 222 such that the second wheel 221 takes the second non-traveling posture.

In the second non-traveling posture, while the second wheel 221 is distanced from the second rail R2, the second wheel 221 does not overlap with the second rail R2, the second feeder cable L2, the first rail R1, and the first feeder cable L1 (also see FIG. 5) in the view along the first direction X and the view along the second direction Y. In other words, in the second non-traveling posture, the second wheel 221 is disposed at a height different from the second rail R2, the second feeder cable L2, the first rail R1, and the first feeder cable L1. As described above, in the second traveling posture, the second wheel 221 overlaps with the second rail R2 in the view along the first direction X (see FIG. 5). Accordingly, when the vehicle V is to travel along the first direction X in a state where the second wheel 221 has the second traveling posture, the second wheel 221 interferes with the second rail R2, so that the vehicle V cannot travel appropriately. However, when the second wheel 221 takes the second non-traveling posture, the second wheel 221 does not overlap with the first rail R1 and the first feeder cable L1 in addition to the second rail R2 and the second feeder cable L2 in the view along the first direction X and the view along the second direction Y (see FIG. 6). Accordingly, in a state where the second wheel 221 has the second non-traveling posture, even when the vehicle V is to travel along the first direction X, the second wheel 221 does not interfere with any of the aforementioned members. This accordingly allows the vehicle V to travel along the first direction X appropriately. On this account, in a case where the vehicle V travels along the first direction X, the control device C controls the second wheel driving section 222 such that the second wheel 221 takes the second non-traveling posture.

In the present embodiment, in a state where the second wheel 221 has the second non-traveling posture, the second guide wheel 223 is distanced from the second rail R2 and does not overlap with the second rail R2, the second feeder cable L2, the first rail R1, and the first feeder cable L1 in the view along the first direction X and the view along the second direction Y. In other words, in a state where the second wheel 221 has the second non-traveling posture, the second guide wheel 223 is disposed at a height different from the second rail R2, the second feeder cable L2, the first rail R1, and the first feeder cable L1. Hereby, in a state where the second wheel 221 has the second non-traveling posture, even when the vehicle V is to travel along the first direction X, the second guide wheel 223 does not interfere with any of the aforementioned members. This accordingly allows the vehicle V to travel along the first direction X appropriately.

As illustrated in FIGS. 5, 6, in the present embodiment, the second power reception section 211 and the second wheel 221 are configured to change their postures in conjunction with each other. In the present embodiment, the second power reception driving section 212 configured to change the posture of the second power reception section 211 and the second wheel driving section 222 configured to change the posture of the second wheel 221 are configured to operate in conjunction with each other. In other words, the change in the posture of the second power reception section 211 and the change of the posture of the second wheel 221 are performed around the same time.

In the present embodiment, the second power reception driving section 212 and the second wheel driving section 222 include a second support mechanism 20 for common use and a second drive source M2 configured to operate the second support mechanism 20. The second power reception section 211 and the second wheel 221 are attached to the second support mechanism 20. In the present embodiment, the second power reception section 211 and the second wheel 221 are attached to the same second support mechanism 20 so that the second power reception section 211 and the second wheel 221 are configured to change their postures in conjunction with each other.

In the present embodiment, the second support mechanism 20 includes a second support member 20b configured to support the second power reception section 211 and the second wheel 221, and a rotating mechanism 20a configured to swing the second support member 20b. The second drive source M2 is constituted by use of an electric motor, for example.

In the present embodiment, the second support member 20b is connected to the body B to be swingable around a swing axis (hereinafter referred to as a "second swing axis Ax2") along the second direction Y. The second support member 20b has a swing base end part connected to the body B via a shaft member rotationally driven by the second drive source M2. The rotating mechanism 20a includes such a shaft member, part of or all the second support member 20b, and the like. That is, the second support mechanism 20 is supported by the body B of the vehicle V to swing around the second swing axis Ax2 along the second direction Y.

In the present embodiment, the second support member 20b supports the second power reception section 211 above the body B in a state where the second power reception section 211 has the second power reception posture (the state illustrated in FIG. 5). Further, the second support member 20b supports the second wheel 221 above the body B in a state where the second wheel 221 has the second traveling posture (the state illustrated in FIG. 5).

Further, the second support member 20b supports the second power reception section 211 below the second rail R2 and the second feeder cable L2 in a state where the second power reception section 211 has the second non-power reception posture (the state illustrated in FIG. 6). Further, the second support member 20b supports the second wheel 221 below the second rail R2 and the second feeder cable L2 in a state where the second wheel 221 has the second non-traveling posture (the state illustrated in FIG. 6).

In the present embodiment, the second drive source M2 operates the second support mechanism 20 so that the second support mechanism 20 changes its posture between a second operation posture (see FIG. 5) in which the second power reception section 211 has the second power reception posture and the second wheel 221 has the second traveling posture and a second pause posture (see FIG. 6) in which the second power reception section 211 has the second non-power reception posture and the second wheel 221 has the second non-traveling posture. Then, in a case where the second support mechanism 20 changes its posture from the second pause posture to the second operation posture, the second wheel 221 is disposed, by swinging of the second support mechanism 20, at a position where the second wheel 221 makes contact with the top surface (the second travel face F20) of the second rail R2, and the second power reception section 211 is disposed at a position where the second power reception section 211 faces the second feeder cable L2 from a latera side (the body B side in the second direction Y) (see FIG. 5). In a case where the second support mechanism 20 changes its posture from the second operation posture to the second pause posture, the second power reception section 211 and the second wheel 221 move reversely to the above. In the present embodiment, in a state where the second support mechanism 20 has the second pause posture, at least part of the second power reception section 211 is stored in the second storage section S2 (see FIG. 6).

As described above, in the present embodiment, in a case where the vehicle V travels on the first rail R1, the control device C controls the first power reception driving section 112 such that the first power reception section 111 takes the first power reception posture, and controls the second power reception driving section 212 such that the second power reception section 211 takes the second non-power reception posture. In the present embodiment, in a case where the vehicle V travels on the first rail R1, the control device C controls the first wheel driving section 122 such that the first wheel 121 takes the first traveling posture, and controls the second wheel driving section 222 such that the second wheel 221 takes the second non-traveling posture. Further, in a case where the vehicle V travels on the second rail R2, the control device C controls the second power reception driving section 212 such that the second power reception section 211 takes the second power reception posture, and controls the first power reception driving section 112 such that the first power reception section 111 takes the first non-power reception posture. In the present embodiment, in a case where the vehicle V travels on the second rail R2, the control device C controls the second wheel driving section 222 such that the second wheel 221 takes the second traveling posture, and controls the first wheel driving section 122 such that the first wheel 121 takes the first non-traveling posture. Hereby, both in a case where the vehicle V travels on the first rail R1 and in a case where the vehicle V travels on the second rail R2, the postures of the first power reception section 111 and the second power reception section 211 are controlled in conjunction with each other, and the postures of the first wheel 121 and the second wheel 221 are controlled in conjunction with each other, so that appropriate power reception and appropriate traveling of the vehicle V can be achieved.

Here, even in a case where the vehicle V changes its travel direction between the first direction X and the second direction Y, the control device C controls the first power reception driving section 112 and the second power reception driving section 212 such that a state where at least either of the first power reception section 111 and the second power reception section 211 receives electric power is maintained. Hereby, a state where the vehicle V always receives the supply of electric power can be maintained.

Figures 7, 8:
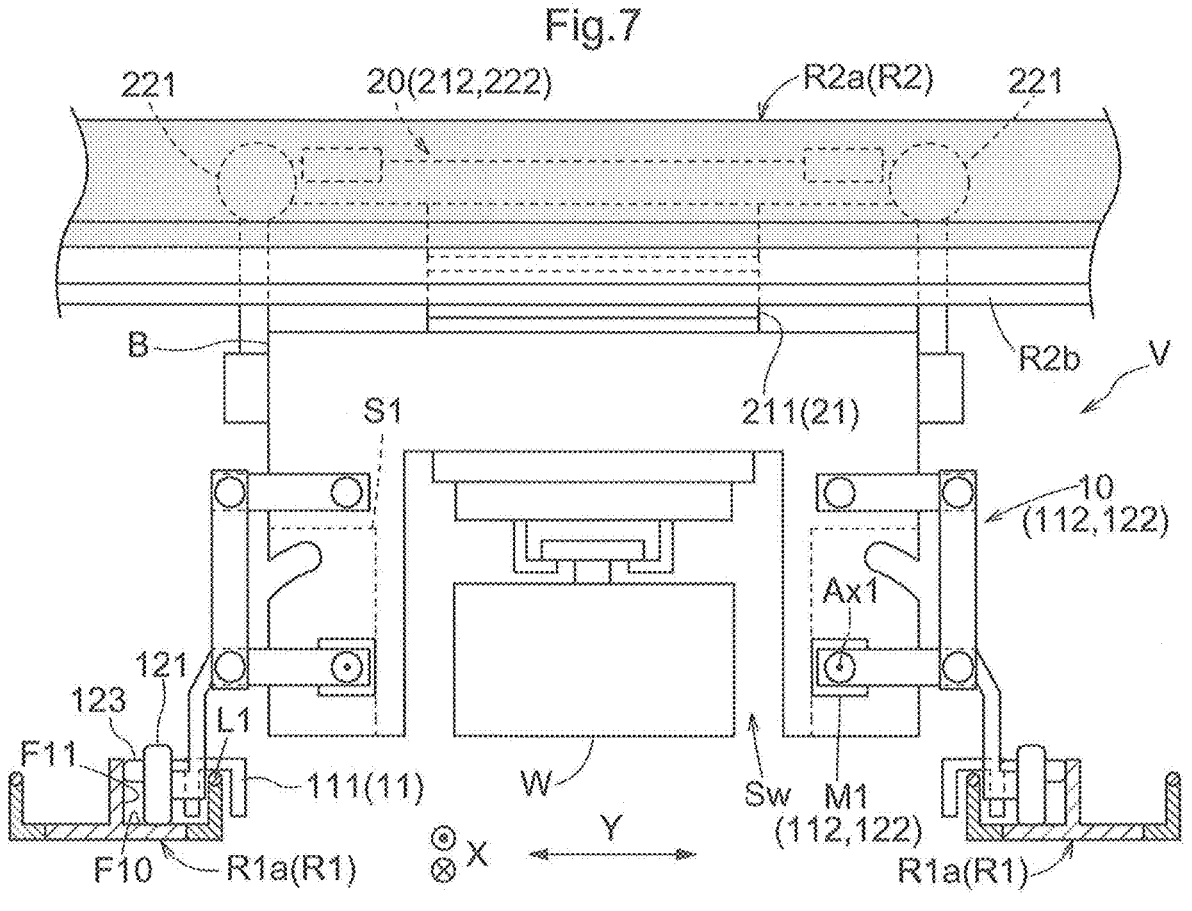
FIG. 7 is a view in the first direction and illustrates a state in the middle of shifting between a state where the vehicle travels in the first direction and a state where the vehicle travels in the second direction.
FIG. 8 is a view in the second direction and illustrates a travel facility in an alternative embodiment.

As illustrated in FIG. 7, in the present embodiment, in a case where a state change is performed between a state where the first power reception section 111 has the first power reception posture and the second power reception section 211 has the second non-power reception posture and a state where the first power reception section 111 has the first non-power reception posture and the second power reception section 211 has the second power reception posture, the control device C controls the first power reception driving section 112 and the second power reception driving section 212 such that a state where the first power reception section 111 has the first power reception posture and the second power reception section 211 has the second power reception posture in the middle of the state change. In other words, in a case where the state change is performed between a state where the vehicle V travels in the first direction X and a state where the vehicle V travels in the second direction Y, the control device C controls the first power reception driving section 112 and the second power reception driving section 212 such that the first power reception section 111 takes the first power reception posture and the second power reception section 211 takes the second power reception posture. In this state, both the first power reception section 111 and the second power reception section 211 receive electric power. After that, the control device C controls the first power reception driving section 112 and the second power reception driving section 212 such that the power reception posture of a power reception section for a rail where the vehicle V is about to travel is maintained and a power reception section for the other rail where the vehicle V does not travel takes the non-power reception posture.

Further, even in a case where the vehicle V changes its travel direction between the first direction X and the second direction Y, the control device C controls the first wheel driving section 122 and the second wheel driving section 222 such that a state where at least either of the first wheel 121 and the second wheel 221 is supported by a rail (the first rail R1 or the second rail R2) is maintained. Hereby, it is possible to restrain the vehicle V from falling off the rail (the first rail R1 or the second rail R2).

As illustrated in FIG. 7, in the present embodiment, in a case where a state change is performed between a state where the first wheel 121 has the first traveling posture and the second wheel 221 has the second non-traveling posture and a state where the first wheel 121 has the first non-traveling posture and the second wheel 221 has the second traveling posture, the control device C controls the first wheel driving section 122 and the second wheel driving section 222 such that a state where the first wheel 121 has the first traveling posture and the second wheel 221 has the second traveling posture in the middle of the state change. In other words, in a case where the state change is performed between a state where the vehicle V travels in the first direction X and a state where the vehicle V travels in the second direction Y, the control device C controls the first wheel driving section 122 and the second wheel driving section 222 such that the first wheel 121 takes the first traveling posture and the second wheel 221 takes the second traveling posture. In this state, the first wheel 121 and the second wheel 221 are both supported by the rails. After that, the control device C controls the first wheel driving section 122 and the second wheel driving section 222 such that a wheel for a rail where the vehicle V is about to travel is maintained in the traveling posture and a wheel for the other rail where the vehicle V does not travel takes the non-traveling posture.

With the travel facility 100 described above, it is possible to cause the vehicle V to appropriately travel along each direction X, Y while the vehicle V receives electric power from the feeder cables L1, L2 disposed along directions intersecting with each other in a view along the top-bottom direction.

OTHER EMBODIMENTS

Next will be described other embodiments of the travel facility.

(1) The above embodiment has described an example in which the second rail body R2a is provided with the second holding portion R2b configured to hold the second feeder cable L2 over the second direction Y. However, the present invention is not limited to such an example, and the second holding portion R2b may be provided separately from the second rail body R2a, as illustrated in FIG. 8, for example. In the example illustrated in FIG. 8, the second holding portion R2b is disposed between the pair of second rail bodies R2a constituting the second rail R2 in the view along the second direction Y. In this case, the second holding portion R2b and the second feeder cable L2 may be disposed above the body B, and the second power reception section 211 may be configured to be raised and lowered relative to the second feeder cable L2. Although details are not illustrated herein, the first holding portion R1b configured to hold the first feeder cable L1 may be also provided separately from the first rail body R1a.

(2) The above embodiment has described an example in which the second power reception section 211 and the second wheel 221 are attached to the same second support mechanism 20 so that the second power reception section 211 and the second wheel 221 change their postures in conjunction with each other. However, the present invention is not limited to such an example, and the second power reception section 211 and the second wheel 221 may be supported by different mechanisms, respectively (a mechanism supporting the second power reception section 211 is omitted in the figure), as illustrated in FIG. 8, for example. In this case, the second power reception section 211 and the second wheel 221 may be configured to change their postures in conjunction with each other or may be configured to change their postures independently. Although details are not illustrated herein, the first power reception section 111 and the first wheel 121 may have the same relationship as above. That is, the first power reception section 111 and the first wheel 121 may be supported by different mechanisms, respectively. Further, the first power reception section 111 and the first wheel 121 may be configured to change their postures in conjunction with each other or may be configured to change their postures independently.

Figure 9:
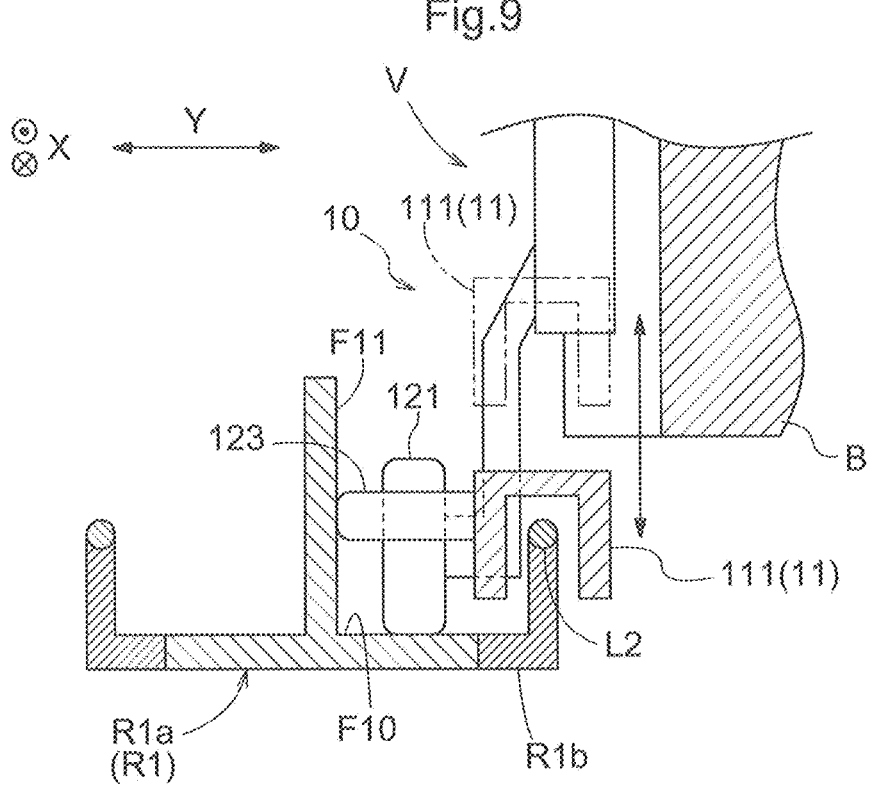
FIG. 9 is a view in the first direction and illustrates the travel facility in the alternative embodiment.

(3) The above embodiment has described an example in which the first support mechanism 10 is supported by the body B of the vehicle V to swing around the first swing axis Ax1 along the first direction X. However, the present invention is not limited to such an example, and the first support mechanism 10 may be supported to move linearly in the top-bottom direction relative to the body B of the vehicle V, as illustrated in FIG. 9, for example. In this case, the first power reception section 111 is raised and lowered relative to the first feeder cable L1 to change its position between the first power reception posture and the first non-power reception posture.

(4) The above embodiment has described an example in which the first rail body R1a includes a pair of first travel faces F10 and a pair of first guide faces F11. However, the present invention is not limited to such an example, and the first rail body R1a may include only one first travel face F10 and only one first guide face F11. Similarly to the above, the second rail body R2a may include only one second travel face F20 and only one second guide face F21.

(5) The above embodiment has described an example in which the first rail R1 and the second rail R2 are disposed at different heights. However, the present invention is not limited to such an example, and the first rail R1 and the second rail R2 may be disposed at the same height. In this case, a crossing part where the first rail R1 intersects with the second rail R2 is provided.

(6) Note that the configuration disclosed in the above embodiment can be applied in combination with the configurations disclosed in other embodiments as long as no inconsistency occurs. In terms of other configurations, the embodiments disclosed in the present specification are also just examples in all respects. Accordingly, various modifications can be made appropriately as far as it does not deviate from the scope of this disclosure.

OUTLINE OF EMBODIMENT

The following describes the travel facility described above.

A travel facility including a vehicle includes: a first rail disposed along a first direction such that the vehicle travels on the first rail; a second rail disposed along a second direction intersecting with the first direction in a view along a top-bottom direction such that the vehicle travels on the second rail; a first feeder cable disposed along the first direction; and a second feeder cable disposed along the second direction. The vehicle includes a first power reception device configured to receive electric power from the first feeder cable, and a second power reception device configured to receive electric power from the second feeder cable. The first power reception device includes a first power reception section, and a first power reception driving section configured to change posture of the first power reception section between a first power reception posture to receive electric power from the first feeder cable and a first non-power reception posture to receive no electric power from the first feeder cable. The second power reception device includes a second power reception section, and a second power reception driving section configured to change posture of the second power reception section between a second power reception posture to receive electric power from the second feeder cable and a second non-power reception posture to receive no electric power from the second feeder cable. In the first power reception posture, the first power reception section does not overlap with the first rail and the first feeder cable in a view along the first direction but overlaps with at least one of the first rail and the first feeder cable in a view along the second direction. In the first non-power reception posture, the first power reception section does not overlap with the first rail, the first feeder cable, the second rail, and the second feeder cable in the view along the first direction and the view along the second direction. In the second power reception posture, the second power reception section does not overlap with the second rail and the second feeder cable in the view along the second direction but overlaps with at least one of the second rail and the second feeder cable in the view along the first direction. In the second non-power reception posture, the second power reception section does not overlap with the second rail, the second feeder cable, the first rail, and the first feeder cable in the view along the first direction and the view along the second direction.

With the configuration, both in a case where the vehicle travels on the first rail and in a case where the vehicle travels on the second rail, it is possible to receive electric power from the feeder cables appropriately. In a case where the vehicle travels on the first rail, the second power reception section configured to receive electric power when the vehicle travels on the second rail takes the second non-power reception posture. In the second non-power reception posture, the second power reception section does not overlap with the second rail, the second feeder cable, the first rail, and the first feeder cable in the view along the first direction and the view along the second direction. This allows the vehicle to travel along the first rail appropriately while the second power reception section interferes no rail and no feeder cable. Further, in a case where the vehicle travels on the second rail, the first power reception section configured to receive electric power when the vehicle travels on the first rail takes the first non-power reception posture. In the first non-power reception posture, the first power reception section does not overlap with the first rail, the first feeder cable, the second rail, and the second feeder cable in the view along the first direction and the view along the second direction. This allows the vehicle to travel along the second rail appropriately while the first power reception section interferes with no rail and no feeder cable. Thus, with this configuration, it is possible to cause the vehicle to appropriately travel along each direction while the vehicle receives electric power from the feeder cables disposed along the first direction and the second direction intersecting with each other in a view along the top-bottom direction.

It is preferable that: the travel facility include a control device configured to control the first power reception device and the second power reception device; and the control device be configured to, in a case where the vehicle travels on the first rail, control the first power reception driving section such that the first power reception section takes the first power reception posture, and control the second power reception driving section such that the second power reception section takes the second non-power reception posture, and in a case where the vehicle travels on the second rail, control the second power reception driving section such that the second power reception section takes the second power reception posture, and control the first power reception driving section such that the first power reception section takes the first non-power reception posture.

With this configuration, both in a case where the vehicle travels on the first rail and in a case where the vehicle travels on the second rail, the postures of the first power reception section and the second power reception section are controlled in conjunction with each other, thereby making it possible to achieve appropriate power reception and appropriate traveling of the vehicle.

In the above configuration, it is preferable that the control device be configured to, in a case where a state change is performed between a state where the first power reception section has the first power reception posture and the second power reception section has the second non-power reception posture and a state where the first power reception section has the first non-power reception posture and the second power reception section has the second power reception posture, control the first power reception driving section and the second power reception driving section such that a state where the first power reception section has the first power reception posture and the second power reception section has the second power reception posture in the middle of the state change.

With this configuration, even in the middle of changing the postures of the first power reception section and the second power reception section, it is possible to secure power reception from at least one of the first feeder cable and the second feeder cable. This accordingly makes it possible to reduce the possibility to cause a situation where the vehicle cannot receive electric power and stops its operation.

It is preferable that: the vehicle include a first travel unit including a first wheel and a first wheel driving section configured to change posture of the first wheel between a first traveling posture and a first non-traveling posture, and a second travel unit including a second wheel and a second wheel driving section configured to change posture of the second wheel between a second traveling posture and a second non-traveling posture; in the first traveling posture, while the first wheel makes contact with a top surface of the first rail and rolls, the first wheel overlap with at least one of the first rail and the first feeder cable in the view along the second direction; in the first non-traveling posture, the first wheel be distanced from the first rail and does not overlap with the first rail, the first feeder cable, the second rail, and the second feeder cable in the view along the first direction and the view along the second direction; in the second traveling posture, while the second wheel makes contact with a top surface of the second rail and rolls, the second wheel overlap with at least one of the second rail and the second feeder cable in the view along the first direction; and in the second non-traveling posture, the second wheel be distanced from the second rail and do not overlap with the second rail, the second feeder cable, the first rail, and the first feeder cable in the view along the first direction and the view along the second direction.

With this configuration, when the first wheel takes the first traveling posture and the second wheel takes the second non-traveling posture, the vehicle can travel along the first rail appropriately while the second wheel does not interfere with the second rail, the second feeder cable, the first rail, and the first feeder cable. Further, when the second wheel takes the second traveling posture and the first wheel takes the first non-traveling posture, the vehicle can travel along the second rail appropriately while the first wheel does not interfere with the first rail, the first feeder cable, the second rail, and the second feeder cable.

In the above configuration, it is preferable that: the first power reception driving section and the first wheel driving section include a first support mechanism for common use, and a first drive source configured to operate the first support mechanism; the second power reception driving section and the second wheel driving section include a second support mechanism for common use, and a second drive source configured to operate the second support mechanism; the first power reception section and the first wheel be attached to the first support mechanism; the second power reception section and the second wheel be attached to the second support mechanism; the first drive source operate the first support mechanism such that posture of the first support mechanism is changed between a first operation posture in which the first power reception section has the first power reception posture and the first wheel has the first traveling posture and a first pause posture in which the first power reception section has the first non-power reception posture and the first wheel has the first non-traveling posture; and the second drive source operate the second support mechanism such that posture of the second support mechanism is changed between a second operation posture in which the second power reception section has the second power reception posture and the second wheel has the second traveling posture and a second pause posture in which the second power reception section has the second non-power reception posture and the second wheel has the second non-traveling posture.

With this configuration, the first power reception driving section and the first wheel driving section can be driven by a common drive source, and the second power reception driving section and the second wheel driving section can be driven by a common drive source. Accordingly, it is possible to easily downsize and simplify the first power reception driving section, the second power reception driving section, the first wheel driving section, and the second wheel driving section.

In the above configuration, it is preferable that: the second rail be disposed to be distanced upward from the first rail; the second feeder cable be disposed to be distanced upward from the first feeder cable; the second support mechanism be supported by a body of the vehicle to swing around a swing axis along the second direction; and in a case where the posture of the second support mechanism is changed from the second pause posture to the second operation posture, the second wheel be disposed, by swinging of the second support mechanism, at a position where the second wheel makes contact with the top surface of the second rail, and the second power reception section be disposed at a position where the second power reception section faces the second feeder cable from a lateral side.

With this configuration, it is possible to appropriately change the posture of the second wheel while the interference of the second wheel with the second rail is avoided in the middle of the posture change, and it is possible to change the posture of the second power reception section appropriately while the interference of the second power reception section with the second feeder cable is avoided.

In the above configuration, it is preferable that: the first rail be disposed to be distanced downward from the second rail; the first feeder cable be disposed to be distanced downward from the second feeder cable; the first support mechanism be supported by the body of the vehicle to swing around a swing axis along the first direction; in a case where the posture of the first support mechanism is changed from the first pause posture to the first operation posture, the first wheel be lowered to the first rail from above and disposed at a position where the first wheel makes contact with the top surface of the first rail, and the first power reception section be disposed at a position where the first power reception section faces the first feeder cable from above.

With this configuration, it is possible to appropriately change the posture of the first wheel while the interference of the first wheel with the first rail is avoided in the middle of the posture change, and it is possible to appropriately change the posture of the first power reception section while the interference of the first power reception section with the first feeder cable is avoided.

It is preferable that: the vehicle include a body, an article storage section provided inside the body and storing an article as a target to be transported, a first storage section storing the first power reception section, and a second storage section storing the second power reception section; the article storage section be formed to open on a bottom surface of the body; the first storage section be provided on a side face of the body; and the second storage section be provided on a top surface of the body.

With this configuration, while an article can be put in and out from the article storage section from the opening on the bottom surface of the body, and the first power reception section and the second power reception section can be stored in respective storage sections. Further, when the first power reception section and the second power reception section can be stored in respective storage sections, it is possible to easily avoid the second power reception section from interfering with the first rail and the first feeder cable when the vehicle travels on the first rail, and it is possible to easily avoid the first power reception section from interfering with the second rail and the second feeder cable when the vehicle travels on the second rail.

INDUSTRIAL APPLICABILITY

The technology according to this disclosure can be used for a travel facility including a vehicle.

What is claimed is:
1. A travel facility comprising:
a vehicle;
a first rail disposed along a first direction and configured for the vehicle to travel on the first rail;
a second rail disposed along a second direction intersecting with the first direction in a view along a top-bottom direction and configured for the vehicle to travel on the second rail;
a first feeder cable disposed along the first direction; and
a second feeder cable disposed along the second direction, wherein:
the vehicle comprises a first power reception device configured to receive electric power from the first feeder cable, and a second power reception device configured to receive electric power from the second feeder cable;
the first power reception device comprises a first power reception section, and a first power reception driving section configured to change posture of the first power reception section between a first power reception posture to receive electric power from the first feeder cable and a first non-power reception posture to receive no electric power from the first feeder cable;
the second power reception device comprises a second power reception section, and a second power reception driving section configured to change posture of the second power reception section between a second power reception posture to receive electric power from the second feeder cable and a second non-power reception posture to receive no electric power from the second feeder cable;
in the first power reception posture, the first power reception section does not overlap with the first rail and the first feeder cable in a view along the first direction but overlaps with at least one of the first rail and the first feeder cable in a view along the second direction;
in the first non-power reception posture, the first power reception section does not overlap with the first rail, the first feeder cable, the second rail, and the second feeder cable in the view along the first direction and the view along the second direction;
in the second power reception posture, the second power reception section does not overlap with the second rail and the second feeder cable in the view along the second direction but overlaps with at least one of the second rail and the second feeder cable in the view along the first direction; and in the second non-power reception posture, the second power reception section does not overlap with the second rail, the second feeder cable, the first rail, and the first feeder cable in the view along the first direction and the view along the second direction.

2. The travel facility according to claim 1, comprising:
a control device configured to control the first power reception device and the second power reception device, wherein:
the control device is configured to:
in a case where the vehicle travels on the first rail, control the first power reception driving section such that the first power reception section takes the first power reception posture, and control the second power reception driving section such that the second power reception section takes the second non-power reception posture; and
in a case where the vehicle travels on the second rail, control the second power reception driving section such that the second power reception section takes the second power reception posture, and control the first power reception driving section such that the first power reception section takes the first non-power reception posture.

3. The travel facility according to claim 2, wherein:
the control device is configured to, in a case where a state change is performed between a state where the first power reception section has the first power reception posture and the second power reception section has the second non-power reception posture and a state where the first power reception section has the first non-power reception posture and the second power reception section has the second power reception posture, control the first power reception driving section and the second power reception driving section such that a state where the first power reception section has the first power reception posture and the second power reception section has the second power reception posture in the middle of the state change.

4. The travel facility according to claim 1, wherein:
the vehicle comprises:
a first travel unit comprising a first wheel and a first wheel driving section configured to change posture of the first wheel between a first traveling posture and a first non-traveling posture; and
a second travel unit comprising a second wheel and a second wheel driving section configured to change posture of the second wheel between a second traveling posture and a second non-traveling posture;
in the first traveling posture, while the first wheel makes contact with a top surface of the first rail and rolls, the first wheel overlaps with at least one of the first rail and the first feeder cable in the view along the second direction;
in the first non-traveling posture, the first wheel is distanced from the first rail and does not overlap with the first rail, the first feeder cable, the second rail, and the second feeder cable in the view along the first direction and the view along the second direction;
in the second traveling posture, while the second wheel makes contact with a top surface of the second rail and rolls, the second wheel overlaps with at least one of the second rail and the second feeder cable in the view along the first direction; and
in the second non-traveling posture, the second wheel is distanced from the second rail and does not overlap with the second rail, the second feeder cable, the first rail, and the first feeder cable in the view along the first direction and the view along the second direction.

5. The travel facility according to claim 4, wherein:
the first power reception driving section and the first wheel driving section comprise a first support mechanism for common use, and a first drive source configured to operate the first support mechanism;
the second power reception driving section and the second wheel driving section comprises a second support mechanism for common use, and a second drive source configured to operate the second support mechanism;
the first power reception section and the first wheel are attached to the first support mechanism;
the second power reception section and the second wheel are attached to the second support mechanism;
the first drive source operates the first support mechanism such that posture of the first support mechanism is changed between a first operation posture in which the first power reception section has the first power reception posture and the first wheel has the first traveling posture and a first pause posture in which the first power reception section has the first non-power reception posture and the first wheel has the first non-traveling posture; and
the second drive source operates the second support mechanism such that posture of the second support mechanism is changed between a second operation posture in which the second power reception section has the second power reception posture and the second wheel has the second traveling posture and a second pause posture in which the second power reception section has the second non-power reception posture and the second wheel has the second non-traveling posture.

6. The travel facility according to claim 5, wherein:
the second rail is disposed to be distanced upward from the first rail;
the second feeder cable is disposed to be distanced upward from the first feeder cable;
the second support mechanism is supported by a body of the vehicle to swing around a swing axis along the second direction; and
in a case where the posture of the second support mechanism is changed from the second pause posture to the second operation posture, the second wheel is disposed, by swinging of the second support mechanism, at a position where the second wheel makes contact with the top surface of the second rail, and the second power reception section is disposed at a position where the second power reception section faces the second feeder cable from a lateral side of the second feeder cable in the first direction.

7. The travel facility according to claim 5, wherein:
the first rail is disposed to be distanced downward from the second rail;
the first feeder cable is disposed to be distanced downward from the second feeder cable;
the first support mechanism is supported by a body of the vehicle to swing around a swing axis along the first direction; and
in a case where the posture of the first support mechanism is changed from the first pause posture to the first operation posture, the first wheel is lowered to the first rail from above and disposed at a position where the first wheel makes contact with the top surface of the first rail, and the first power reception section is disposed at a position where the first power reception section faces the first feeder cable from above.

8. The travel facility according to claim 1, wherein:

the vehicle comprises a body, an article storage section provided inside the body configured to store an article as a target to be transported, a first storage section storing the first power reception section, and a second storage section storing the second power reception section;

the article storage section is formed to open on a bottom surface of the body;

the first storage section is provided on a side face of the body; and the second storage section is provided on a top surface of the body.

* * * * *